United States Patent [19]

Maelzer et al.

[11] Patent Number: 4,896,107
[45] Date of Patent: Jan. 23, 1990

[54] TEST PIN FOR AN ADAPTER FOR CONNECTING TEST CONTACTS ON THE GRID OF A PRINTED CIRCUIT BOARD TESTING DEVICE WITH TEST POINTS OF A TEST-PIECE ON AND/OR OFF THE GRID

[75] Inventors: Martin Maelzer, Hagenburger Str. 26, D-3050 Wunstorf; Rüdiger Dehmel, Wunstorf; Hans-Hermann Higgen, Stadthagen; Andreas Gülzow, Springe, all of Fed. Rep. of Germany

[73] Assignees: Erich Luther; Martin Maelzer, both of Wunstorf, Fed. Rep. of Germany

[21] Appl. No.: 121,063

[22] Filed: Nov. 16, 1987

[30] Foreign Application Priority Data

Nov. 18, 1986 [DE] Fed. Rep. of Germany ....... 3639360

[51] Int. Cl.$^4$ ............................ G01R 1/00; G01R 1/04
[52] U.S. Cl. ............................ 324/158 P; 324/158 F; 324/72.5
[58] Field of Search .............. 324/73 PC, 72.5, 158 P, 324/158 F; 439/482

[56] References Cited

FOREIGN PATENT DOCUMENTS 164672 12/1985 European Pat. Off. .
3444708 6/1985 Fed. Rep. of Germany .
3533218 3/1986 Fed. Rep. of Germany .
3507619 9/1986 Fed. Rep. of Germany .

OTHER PUBLICATIONS

"Taper-Lock Probing Device", by Dopp et al., IBM Tech. Disc. Bull., vol. 13, #9, 2/71, pp. 2613.
"Spring Test Probe", by Barnum, IBM Tech. Disc. Bull., 12/73, pp. 2167-2168, vol. 16, #7.
"Twin Contact Multiple Connector", by Bohannon, Western Electric, 4/71, #22, pp. 9-10.
Ingun Prumitted bau Konstanz, "Adapter Und Zubehor VA-Katalog", Feb. 1985 (in German).
"Probe-to-Coupling Block Pressure Contact with Dust Seal", by Faure et al., IBM Tech. Disc. Bull., vol. 18, No. 3, 8/75, p. 701.

Primary Examiner—Reinhard J. Eisenzopf
Assistant Examiner—W. Burns
Attorney, Agent, or Firm—Fitzpatrick, Cella, Harper & Scinto

[57] ABSTRACT

A test pin for an adapter for connecting test contacts of a printed circuit board testing device that are located on a grid with test points of a test-piece such as a printed circuit board located on and/or off the grid, wherein in order to connect associated test contacts and test points the test pin can be inserted into guide holes at different inclinations in the adapter and has a pointed contact section that is directed towards the respective contact point of the circuit board and projects from the adapter and an adjacent guidance section that is guided in the associated guide hole of the adapter, is designed so that test-pieces with their test points only a relatively short distance apart can be tested. This is achieved by reducing the cross-section of the guidance section conically or stepwise towards the contact section.

17 Claims, 3 Drawing Sheets

TEST PIN FOR AN ADAPTER FOR CONNECTING TEST CONTACTS ON THE GRID OF A PRINTED CIRCUIT BOARD TESTING DEVICE WITH TEST POINTS OF A TEST-PIECE ON AND/OR OFF THE GRID

TECHNICAL FIELD OF THE INVENTION

The invention relates to a test pin for an adapter for connecting test contacts of a printed circuit board testing device that are located on a grid with test points of a test-piece such as a printed circuit board located on and/or off the grid wherein, in order to connect associated test contacts and test points, the test pin can be inserted into guide holes at different inclinations in the adapter.

BACKGROUND OF THE INVENTION AND PRIOR ART

For the purpose of electrically connecting test contacts on the grid of a printed circuit board testing device with test points of a test piece that are on and/or off the grid, an adapter is fitted with test pins corresponding in number to the number of test contacts or test points, the test pins being inserted in the adapter at various inclinations so that they connect the test contacts and test points and their ends form contact points for the test contacts or test points as the case may be. Fitting the adapter with the test pins can be done either manually or mechanically, and either semi-automatically or fully automatically.

A test pin of the kind described above is the subject of an earlier proposal by the applicant. In this arrangement the test pin has a cylindrical shaft as a guidance section that is tapered conically to a point at the end, the angle of the point being about 90°. The pointed end forms the contact section of the test pin.

Forming such a relatively blunt tip on the test pin has the following purpose. In the arrangement described above the test pin can be pushed into guide hole sections that extend through superimposed guide plates of the adapter. To ensure that the tip of the test pin is introduced into each successive guide hole in the guide plates the guide holes are displaced relatively to each other so that the tip of the test pin lands inside the rim of each successive guide hole. Thus on each encounter the test pin is guided on the rim of a hole and into that hole and thus into the correct position.

This known arrangement has proven to be very advantageous, but it still needs to be improved, for the following reasons. Because of the predetermined thickness of the test pin it is only possible to test test-pieces whose test points are relatively far apart. This limits the field of use of this adapter, particularly for so-called SMD test pieces.

OBJECT OF THE INVENTION

The object of the invention is to provide a test pin of the above-mentioned kind so that it can also be used to test test pieces with test points a relatively small distance apart and/or with test points lying far off the grid.

SUMMARY OF THE INVENTION

This object is achieved by by forming a test pin with a pointed contact section which can be directed toward a respective contact point of a circuit board, and an adjacent guidance section which can be guided in an associated hole in an adapter, and forming the guidance section such that its cross section is reduced progressively, e.g. conically or stepwise, towards the contact section.

In the arrangement according to the invention the test pin or pins can be set at such a great inclination that their tips are always close to the neighbouring test pin. In other words the tip of the test pin is shaped so that at the maximum possible inclination of the test pin—viewed in a projection at right angles to the adapter—its tip forms an extremity or lies on the perimeter of its projection image. With the arrangement according to the invention the distance between the test points can be quite substantially reduced. In this connection it should be noted that the distance between the test points also depends on the wall thickness required for reasons of strength between two neighbouring guide holes in the adapter. Consequently arrangements are also possible within the scope of the invention, in which the tip of the test pin is at a distance inside the frame of the projection image that is somewhat less than half the wall thickness between the neighbouring guide holes.

The arrangement according to the invention with a uniformly or conically tapered test pin leads to a test pin that is universal in respect of different maximum inclinations. In addition it has the advantage that the extent of the displacements of the guide holes in an adapter having guide plates can be determined using simpler criteria. The stepped arrangement is advantageous on manufacturing grounds, since such a test pin can be made by hammer forging.

The lengths of the convergence according to one specific aspect of the invention are determined by the maximum inclination of the test pin.

The conical transition from step to step according to a further aspect ensures trouble-free introduction of the test pins into the guide holes.

The shape according to yet another aspect of the invention contributes to the stabilization of the test pin in the region of its tip. This aspect can involve both a progressive tapering and a conical tip with a conical angle greater than the other part of the taper. It is also advantageous to round off or slightly blunt the tip of the test pin; this also represents a progressive tapering.

Because of the tapering according to the invention the test pin is flexible, particularly in the region of its tip. Whilst a certain degree of flexibility can be regarded as an advantage, it is desirable at least to avoid substantial bending of the test pin. This is achieved by providing the test pin with a diameter of about 0.4 mm in the region where it is to be guided by the lowest guide plate.

Further, according to a still further aspect of the invention, the provision of a spherical head at the end opposite its tip leads both to a trouble-free and/or reliable contact with the respective contact head and to restriction of the depth of insertion into the adapter and/or to the avoidance of jamming.

BRIEF DESCRIPTION OF THE DRAWINGS

The invention will now be described in more detail by way of example with reference to embodiments shown in simplified drawings, in which.

DETAILED DESCRIPTION OF PREFERRED EMBODIMENTS OF THE INVENTION

Figure 1:
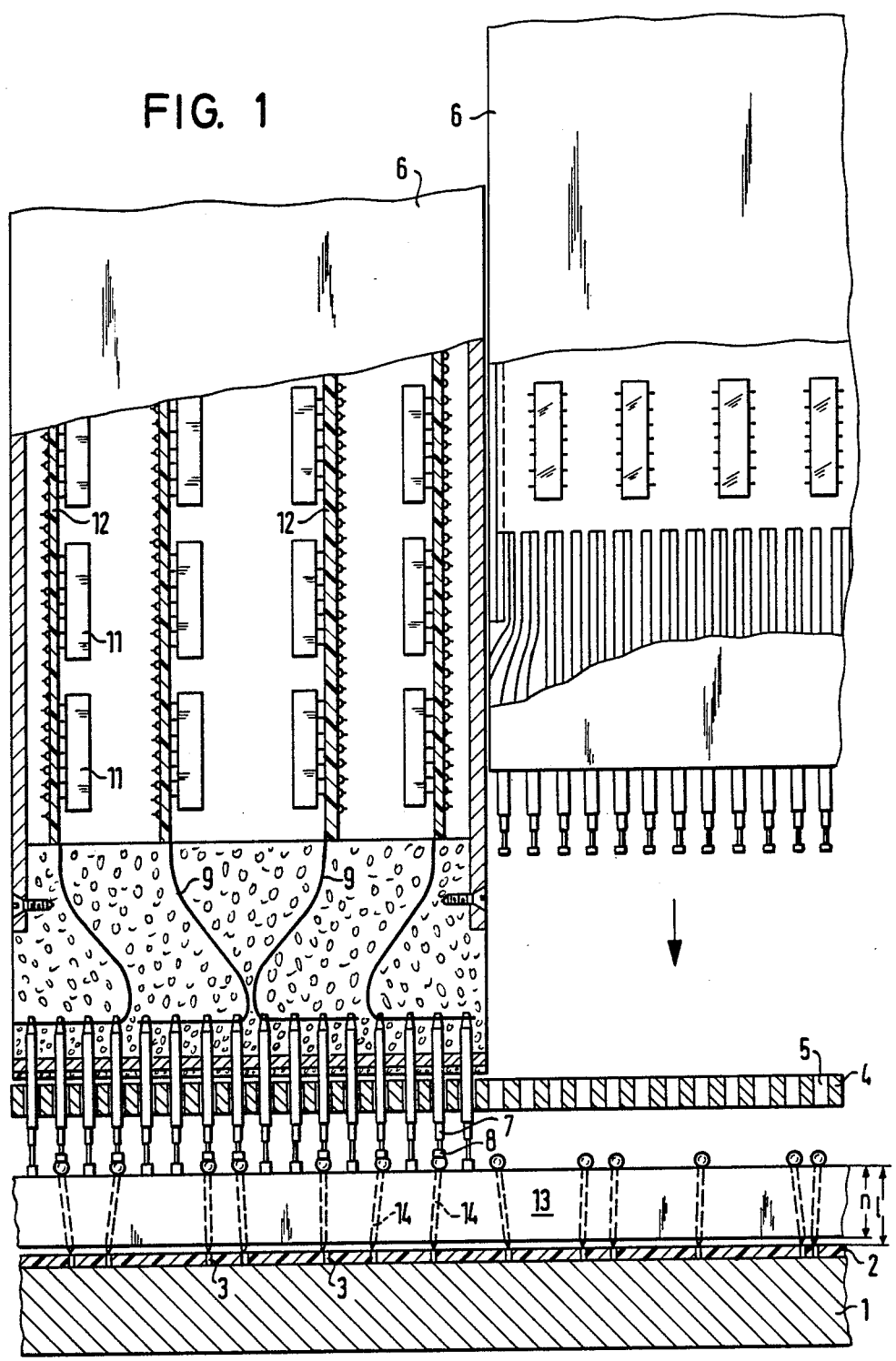
FIG. 1 shows a partial section through a printed circuit board testing device, the section being at right angles to the adapter fitted with test pins that is fitted to the device.

In FIG. 1 a reception plate of the device for testing circuit boards, which is not shown as a whole, is indicated by 1. On this reception plate 1 there is a printed circuit board 2 with test points 3. Above the printed circuit board 2 to be tested there is a perforated grid plate 4 in which the holes 5 are arranged on the grid and two modules 6 that are movable towards and away from the printed circuit board 2 and are provided on their lower faces with test contacts 7 in the form of pins which pass through the holes 5 in the perforated grid plate 4 when a module 6 is in its lowered position. The test contacts 7 carry telescopically extendible and retractable test contact heads 8 that are pre-stressed towards their outer end position by a spring (not shown).

The test contacts 7 are fixed in the module 6 by casting and are connected by electrical leads 9 to circuit boards 12 carrying IC integrated circuit chips 11 that are arranged within the modules 6 and constitute, together with the circuit boards 12, the IC chips 11 and possibly also further components, a partial switching matrix associated with the test contacts 7.

On the printed circuit board 2 there is a grid-matching adapter 13 having a plurality of test pins 14 that pass through it and connect the test contacts 7 arranged on the grid with the test points 3 arranged on and/or off the grid. The test pins are therefore not aligned with the respective test contacts but extend obliquely through the adapter 13, with their heads at the top and overlengths at the bottom projecting from the adapter 13 and forming contact points raised from the upper and lower sides thereof.

Figure 2:
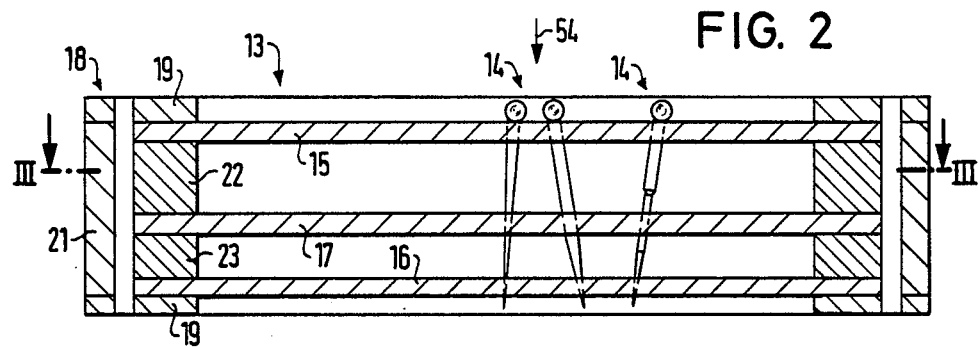
FIG. 2 shows the adapter in vertical section.

The adapter 13 comprises several superimposed guide plates spaced apart from one another. In the embodiment according to FIG. 2 there are three guide plates, the top one being numbered 15, the bottom one 16 and the middle one 17. Three test pins 14 are indicated, which will be described in detail later. The adapter has a frame, indicated generally by 18, which can consist of frame parts 19, 21 in which the guide plates 15 to 17 are positioned by means of spacer rails 22, 23 arranged between them. The spacer rails 22, 23 each likewise form a frame (cf. FIG. 3), whereby the guide plates 15, 17, are supported around their whole periphery and are thus largely stabilised.

Figure 3:
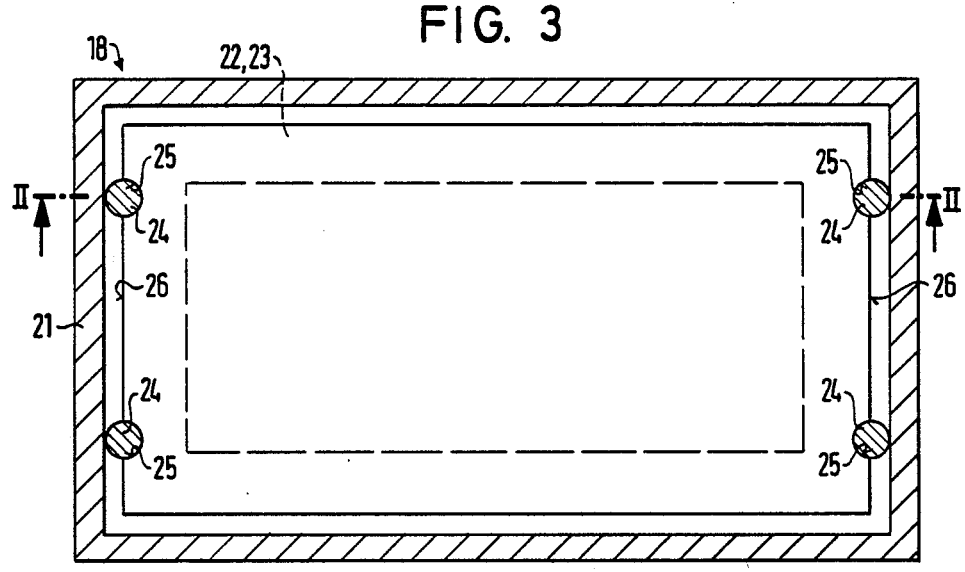
FIG. 3 shows the section on III—III in FIG. 2.

As is clearly shown in FIG. 3, the horizontal positioning of the guide plates 15 to 17 in the frame 18 is effected by vertical retaining bolts 24, preferably of circular section, which can be fixed in various ways in the frame 18, particularly in the upper and lower parts 19 of the frame. They can for example be placed in holes with grub screws serving for axial fixing. In the present embodiment four retaining bolts 24 are provided, arranged on opposite sides and spaced apart from one another. The retaining bolts 24 engage in and lock substantially semicircular transverse grooves 25 of the same cross-section located in corresponding opposite edges of the guide plates 15 to 17. This arrangement makes for easy assembly and disassembly of the guide plates 15 to 17, with reliable positioning, since these do not have to be inserted parallel but can be pivoted in or out around one of the edges indicated by 26. Between the frame 18 and the periphery of the guide plates 15 to 17 or their edges 26 is a gap that enables the guide plates to be gripped, possibly with a tool. An advantageous way of forming the transverse grooves 25 is to make these initially as holes, e.g. by punching or drilling, in precisely fixed positions in guide plates 15 to 17 of larger dimensions, and then cutting away the respective edges, e.g. by milling, until semi-circular transverse grooves 25 result.

Figure 4:
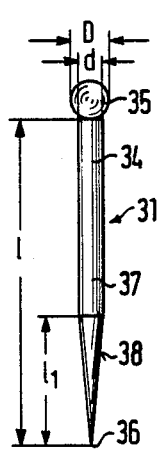
FIGS. 4 to 6 show various designs of test pins.
Figure 5:
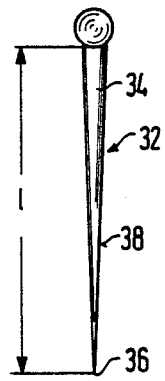
Figure 6:
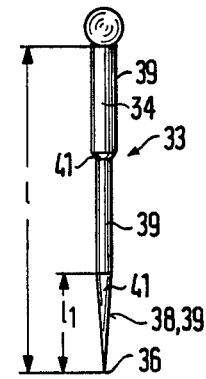

Each of the test pins shown in FIGS. 4 to 6 as 31, 32, and 33 consists of a shaft 34 of circular cross-section that has a spherical head at one end and is pointed at the other end. The tip is indicated in each case by 36.

The shaft 34 of the test pin 31 according to FIG. 4 at first runs cylindrically from the head 35 (shaft section 37) and is then tapered conically to its tip 36. The taper is indicated by 38 and extends over part ($l_1$) of the length l of the shaft; the length $l_1$ follows from the consideration that the generated surface of the taper must lie within a cylindrical envelope perpendicular to the guide plates.

The test pin 32 according to FIG. 5 is tapered conically down to the tip 36 over the whole length l of its shaft.

The test pin 33 according to FIG. 6 is tapered stepwise to the tip 36, the steps indicated by 39 being cylindrical. The transitions 41 from step to step are conically bevelled. The bottom step 39 in FIG. 6 is followed by a conical tip 41, the length $l_1$ of which is similarly determined.

To strengthen the tip 36 it is advantageous to form it by a slight blunting 30, which can be done by progressive tapering, rounding off, slight flattening or even by forming a conical point having a larger conical angle $w_1$ then the angle w of the main taper, indicated generally by 42. A tip 36 formed in this way is shown, by way of example, on a larger scale in FIG. 7.

In the embodiment shown in FIG. 6 the number of the steps 39 can depend on the number of guide plates used, i.e. at least in the upper part of the adapter 13 a step can be associated with each guide plate.

In the present embodiments the greatest diameter d of the shaft is 1.3 to 1.4 mm, while the diameter D of the head 35 is about 2 mm.

Figure 8:
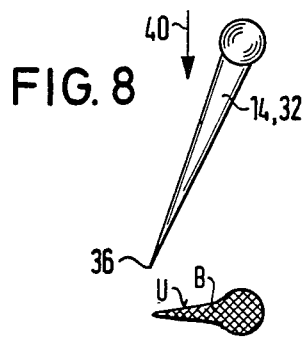
FIG. 8 shows a test pin and its projection image.

FIG. 8 shows a side view of a test pin 32 in the most inclined position together with its projection image 8 in the projection from above, i.e. at right angles to the guide plates and along the arrow 40. This shows clearly that in the projection image B the tip is on its perimeter U.

Figure 9:
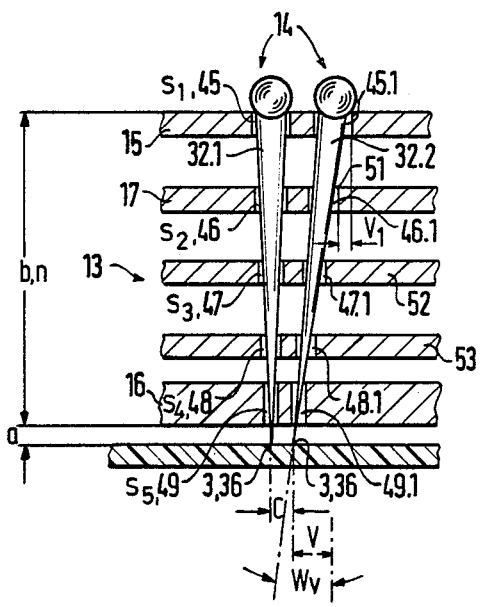
FIGS. 9 and 10 show various positions and inclinations for test pins in the adapter.
Figure 10:
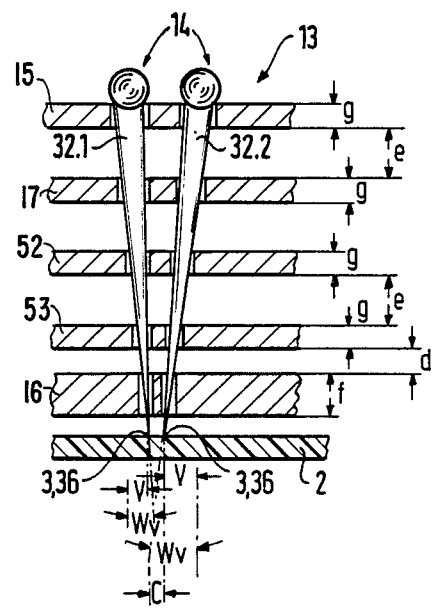

The arrangements of test pins in FIGS. 9 and 10 represent two test pin positions which in principle have maximum inclination, in which they connect the test contact heads 8 with the test points 3 of the printed circuit board 2. In the example according to FIG. 9, in which test pins 32 according to FIG. 5 are used, the test pins 32.1 and the cylindrical guide holes 45 to 49 that receive it are positioned at right angles to the guide plates, i.e. there is no laterial displacement between the guide holes 45 to 49; or in other words the guide holes 45 to 49 are on the grid. In contrast to this the test pin 32.2 is in a position of maximum inclination in which its tip 36 is displaced relative to the respective head 35 and guide hole 45.1 by the displacement V towards the test pin 32.1. The guide holes 46.1 to 49.1 are thus off the grid. The wall thickness between the guide holes 49 and 49.1 is determined on the one hand according to the strength requirements and on the other hand according to the angle of displacement $w_v$ and the distance of the point 36 from the lowest guide plate 16, which amounts to about 0.6 mm and represents the contact section of the test pin. The remaining section b of the shaft 34 of the test pin is the guidance section, on which the test pin is radially positioned. The guidance section b corresponds to the height n of the adapter 13. The arrangement according to the invention enables distances c between the points 36 to be achieved that amount to about 0.6 mm. Such small distances c are particularly desirable for SMD (surface mounted device) test pieces.

The displacement $v_1$ between the guide hole 45.1 in the guide plate 15 and the guide hole 46.1 in the guide plate 16 is such that, on introducing the test pin 32.2 vertically, its tip meets the guide hole 46.1 at a position slightly inside its rim 51 so that the test pin 32.2 necessarily enters the guide hole 46.1 and is thus inclined. The guide holes 47.1 and 48.1 in the two additional guide plates 52, 53 present between the guide plate 16 and the bottom guide plate 16 in the embodiments shown in FIGS. 9 and 10 can be correspondingly displaced so that when there is a slightly blunted tip 36 (see FIG. 7) or a taper 38 according to FIG. 4 a corresponding effect is produced on insertion into the respective guide hole. In the case of the embodiment according to FIG. 5 it should however basically be explained that the first two guide plates 15 and 17 can ensure reliable guidance into the bottom guide hole 49, 49.1, since the sides of the shaft 34 are straight. In this caes the respective guide holes 45 to 49, 45.1 to 49.1 belonging to the guide plates 15 to 17, 52, 53 preferably have the same diameter. However the diameter of the guide holes in the guide plates 15 to 17, 52, 53 should be adapted to the tapering diameter of the test pin from guide plate to guide plate, apart from the cylindrical region 37 of the test pin 31. The diameters of the guide holes 45 to 49 and 45.1 to 49.1 thus decrease towards the tip 36 of the test pin 14.

The clearance $S_1$ to $S_5$ in the guide holes decreases in the direction of insertion 54 (FIG. 2) of the test pin 32. FOr more accurate guidance a clearance $S_5$ of only 0.1 to 0.2 mm is provided for the lowest guide hole 49, 49.1.

The arrangement described above makes for reproducible positioning of the test pins in the positions in the guide plates predetermined by the guide holes.

The function of the guide plates 52, 53 is essentially to provide laterial support, since in this region the guide pins 14 and 31,33 are very thin, and therefore flexible, because of the tapered cross-section 38. The supporting function is particularly effective if in use the test pin 14 is placed under axial pressure so as to contact the test points 3 and the test contact heads 8. For the same purpose the distance d between the bottom guide plate 16 and the guide plate 53 above it is smaller than the distance e between the other guide plates, these other distances e preferably being equal.

In the embodiment according to FIG. 10 test pins 32 are likewise used, the displacement V or displacement angle $W_v$ being smaller than the embodiment previously described, since the tips 36 of the two test pins 32.1, 32.2 are displaced or inclined towards one another by the same displacement V.

From FIGS. 9 and 10 it can be clearly seen that because of the tapering of the test pin 14 according to the invention the distance C between the tips of two adjacent test pins 14, at least one of which is inclined, can be substantially reduced. In the present embodiment the smallest distance C amounts to 0.6 mm. That is to say, even test pieces (circuit boards) with a small distance between test points 3 can be tested.

Figure 11:
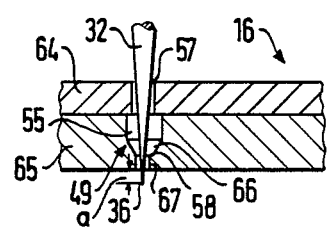
FIGS. 11 and 12 show details of the guidance of the test pins on a larger scale.
Figure 12:
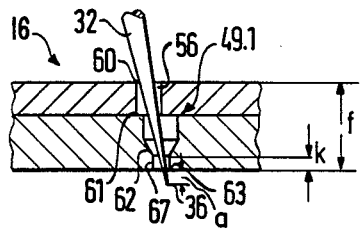

Further features making for improved lateral support of the test pins 14 and 31 to 33 can be seen from FIGS. 11 and 12. One feature consists in making the lowest guide plate 16 thicker (f) than the thickness g of the other guide plates 15, 17, 52, 53, which can have the same thickness as one another. The greater the thickness f, the greater are the supporting sections, which can be particularly effectively used when the guide holes 49, 49.1 are conically shaped (not shown) to match the taper 38 of the test pin 14, or are arranged in steps. These steps can be formed on the one hand by a widening 55, approximately in the middle of the hole, in the guide hole 49, 49.1 and/or by at least one displaced section 56 of the hole, whereby, with corresponding adaptation of the respective hole diameter to the diameter of the taper 38, laterally supportive hole edges 57, 58 (FIG. 11) and 60 to 63 (FIG. 12) result. It is advantageous, in order more easily to realise the widening 55 of the hole and the displaced hole section 56, to form the bottom guide plate 16 in two parts 64, 65. It is also recommended to make the distance k of the hole widening 55 from the bottom of the bottom guide plate 16 small, preferably about 1 mm, so that when the test pin 14 is substantially vertical a point of support (hole rim 58) is obtained that is as near as possible to the tip 36 (FIG. 11). The transition between the bottom of the hole widenings 55 to smaller hole sections 67 takes place through conical sections 66.

When the test pin 14 is inclined (FIG. 12) the tip 36 is already supported on the hole rim 63 at the bottom of the lowest guide plate 16, which is about 3 mm thick in the embodiments according to FIGS. 11 and 12. The distance a of the tip 36 from the lowest guide plate 16 amounts to about 0.8 mm.

Figure 7:
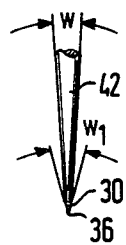
FIG. 7 shows an enlarged view of the tip of a test pin.

Insofar as the test pin 14 exhibits a progressive taper 30 according to FIG. 7 it is preferable for the length of the progressive taper 30 to be the same as or smaller than the distance k in FIG., 12 so as to ensure good guidance of the test pin 14 on raising the circuit board 2 into position for testing.

Within the scope of the invention it is also possible to provide, instead of cylindrical guide holes, guide holes that are adapted to the shape of the test pins, in particular conical guide holes.

What is claimed is:

1. A test pin for an adapter for connecting test contacts of a printed circuit board testing device that are located on a grid with test points of a testpiece such as a printed circuit board located on and/or off the grid, wherein in order to connect associated test contacts and test points the test pin can be inserted into guide holes at different inclinations in the adapter, said test pin comprising a pointed contact section that is directed towards the respective contact point of the circuit board and that projects from the adapter, and an adjacent guidance section that is guided in an associated guide hole of the adapter, the cross-section of the guidance section being greater than that of the contact section and being reduced along its length to that of the contact section whereby the pointed contact sections of neighboring test pins of converging inclination can contact closely positioned test points of a printed circuit board.

2. A test pin according to claim 1, wherein the cross-section of the test pin is reduced over substantially its whole length.

3. A test pin according to claim 1, wherein the cross-section of the guidance section is reduced in steps and the transition from step to step towards the contacting section is conically tapered.

4. A test pin according to claim 1, wherein the adapter comprises a plurality of guide plates, and wherein the cross-section of the guidance section is reduced stepwisely, the number of steps being equal to or one less than the number of guide plates.

5. A test pin according to claim 1 wherein the cross-section of the test pin is progressively tapered near its pointed contact section.

6. A test pin according to claim 1, wherein the diameter of the test pin in a region thereof where it can project through a lower adapter plate guide hole is about 0.4 mm.

7. A test pin according to claim 1, wherein the end thereof opposite its pointed contact section is formed with a sperical head.

8. A test pin according to claim 1, wherein the cross-section of a first portion of the guiding section that is adjacent the contact section is reduced toward the contact section, and the cross-section a portion of the guiding section that is adjacent the first portion is substantially constant.

9. A test pin according to claim 1, wherein the contact section of the test pin projects by about 0.3 to 1.5 mm, preferably about 0.8 mm, from the adapter.

10. A test pin for contacting a test point on a test plane while said test pin is carried in a guide member having an insertion position, a guide section and a projection position, said test pin comprising a straight shank having a head at one end to hold said shank in said guide member to extend at various inclinations from the insertion position when the test pin is carried in the adapter, a tapered guide portion, and a tip at the other end of said shank to extend from the projection position when the test pin is carried in the adapter, said guide portion being tapered so that a thickness of said guide portion adjacent said head is greater than a thickness of said guide portion adjacent said tip and guided in an associated guide hole of the member, the taper of siad guide portion being such that adajcent ones of said pins extend at converging inclinations in said adapter to permit their tips to contact said test plane at locations close to each other.

11. A test pin according to claim 10, wherein the taper of the guide portion is a stepwise taper.

12. A test pin according to claim 11, wherein the guide section of the adapter comprises a plurality of plates, and the number of steps in said guide portion is equal to or one less than the number of plates.

13. A test pin according to claim 10, wherein the taper of said guide portion is continuous.

14. A test pin according to claim 10, wherein the cross section of the portion of said guide portion that is adjacent said head is substantially constant, and wherein the cross section of the portion of said guide portion that is adjacent said tip is tapered.

15. A test pin according to claim 10, wherein said test pin is cylindrical and the diameter of said tip where it projects from the projection position of the adapter is about 0.4 mm, thereby to permit limited flexure of said test pin in response to contact with the test point on the tested plane.

16. A test pin according to claim 10, wherein said head comprises a spherical member.

17. A test pin according to claim 1, wherein the cross-section of the guidance section is reduced in steps.

* * * * *